(12) United States Patent
Huebl

(10) Patent No.: US 7,477,498 B2
(45) Date of Patent: Jan. 13, 2009

(54) METHOD AND PROTECTIVE CIRCUIT AGAINST OVERVOLTAGE

(75) Inventor: Markus Huebl, Markt Schwaben (DE)

(73) Assignee: Qimonda AG, Munich (DE)

( * ) Notice: Subject to any disclaimer, the term of this patent is extended or adjusted under 35 U.S.C. 154(b) by 15 days.

(21) Appl. No.: 11/768,075

(22) Filed: Jun. 25, 2007

(65) Prior Publication Data

US 2008/0002323 A1   Jan. 3, 2008

(30) Foreign Application Priority Data

Jun. 24, 2006   (DE) ................. 10 2006 029 142

(51) Int. Cl.
*H02H 3/22* (2006.01)
(52) U.S. Cl. ........................ 361/56; 361/111
(58) Field of Classification Search .................. 361/56, 361/91.1, 111
See application file for complete search history.

(56) References Cited

U.S. PATENT DOCUMENTS

| 5,559,659 | A | 9/1996 | Strauss |
| 6,965,503 | B2 | 11/2005 | Connor et al. |
| 7,196,890 | B2 * | 3/2007 | Smith ................. 361/91.1 |
| 2002/0027755 | A1 | 3/2002 | Andresen et al. |

FOREIGN PATENT DOCUMENTS

EP   0818890   1/1998

* cited by examiner

*Primary Examiner*—Danny Nguyen
(74) *Attorney, Agent, or Firm*—Patterson & Sheridan, L.L.P.

(57) ABSTRACT

Embodiments of the invention relate to an integrated circuit, a protective circuit and a method of operating a protective circuit. One embodiment includes an electrical line, a holding circuit, a control circuit and a protective element, wherein the holding circuit, the control circuit and the protective element are selectively connected to the electrical line. The protective element is selectively connected to the electrical line to, discharge the electrical line, depending on the respective states of the holding circuit and the control circuit.

17 Claims, 7 Drawing Sheets

METHOD AND PROTECTIVE CIRCUIT AGAINST OVERVOLTAGE

CROSS-REFERENCE TO RELATED APPLICATIONS

This application claims foreign priority benefits under 35 U.S.C. §119 to co-pending German patent application number DE 10 2006 029 142.5-34, filed 24 Jun. 2006. This related patent application is herein incorporated by reference in its entirety.

BACKGROUND OF THE INVENTION

Field of the Invention

The invention relates to a protective circuit and method for operating the same.

SUMMARY OF THE INVENTION

An embodiment of the invention refers to the provision of an improved protective circuit.

A further embodiment of the invention refers to a method for protecting a line against overvoltage.

One embodiment of the protective circuit consists in the use of a method and a holding circuit for detecting an increased voltage, for example an electrostatic discharge. As a result, a device (control circuit) is used which may have a small area, for example in the case of integration into an integrated circuit, such as, e.g., a memory component. The holding circuit and the control circuit are supplied with voltage by the line to be protected, wherein the holding circuit, after the application of a voltage, undergoes transition from a first to a second state within a holding time. The control circuit undergoes transition from a quiescent state to an operating state within a start time, in which operating state the control circuit is supplied with enough voltage for switching the protective element. The faster the voltage on the line rises, the shorter the start time may be. In an operating state, the control circuit drives the protective element if the holding circuit is still in the first state. The control circuit may be formed in such a way that in the case of a normal switch-on operation, the start time is longer than the holding time. Consequently, in the case of a normal rise of the voltage on the line, the protective element may not be driven. If a great voltage rise occurs, then the start time may become shorter than the holding time.

In one embodiment, the control circuit is formed in such a way that the start time decreases as the temporal change of the voltage on the line rises, and, starting from a threshold value of the temporal change of the voltage, the operating state is attained before the end of the holding time. As a result, starting from a defined threshold value for the temporal change of the voltage on the line, a first state of the holding circuit is detected by the control circuit and a drive signal is output to the protective element in order to connect the line to a discharge path and protect it from overvoltage.

In a further embodiment, the holding circuit is formed in the form of a holding circuit which, upon application of a voltage, undergoes transition from an unstable state to a stable state within the holding time, wherein the holding circuit emits different output signals to the control circuit in the stable and in the unstable state.

In a further embodiment, the holding circuit is formed in the form of two inverter circuits coupled to one another. The construction of two inverter circuits affords the desired function of the bistable holding circuit using simple means.

The two inverter circuits are for example formed in identical fashion. In a further embodiment, the inputs of the inverter circuits are connected via in each case two capacitors to a reference line and to an electrical line to be protected.

Furthermore, the control circuit can have a driver circuit for amplifying the output signal.

In the discharge path it is possible to provide for example a field effect transistor or a thyristor which is connected to the electrical line to be monitored and a ground line and, in the case of an increased electrical charge, conductively connects the electrical line to a discharge path.

In a further embodiment, the protective circuit is arranged in an integrated circuit, for example a memory device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
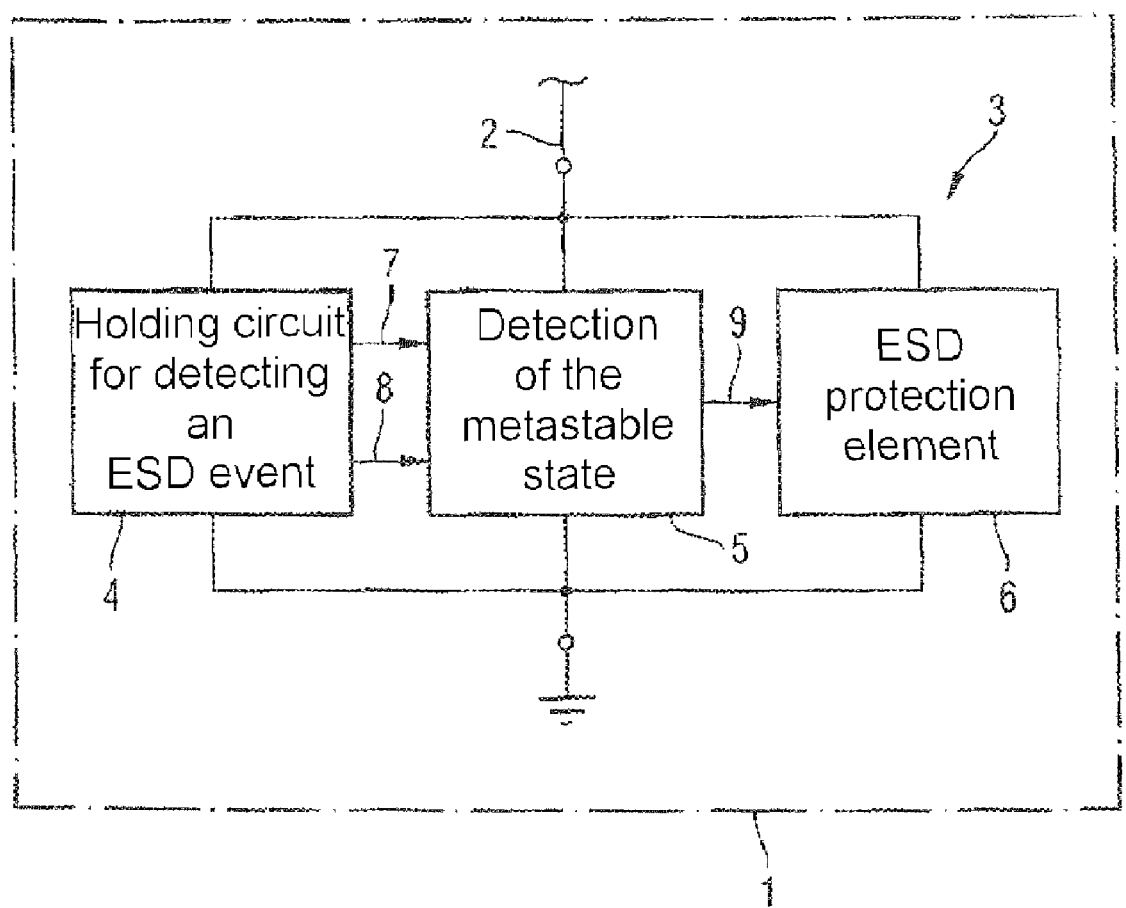
FIG. 1 shows a schematic illustration of a memory component with a protective circuit, according to one embodiment.

FIG. 1 shows, in a schematic illustration, an electrical circuit 1, which can be formed for example in the form of an electronic component. An electronic component may contain for example an integrated circuit, such as e.g. a memory circuit. The memory circuit may be formed for example in the form of a DRAM or SRAM or a flash memory.

The electrical circuit 1 has a multiplicity of electrical lines 2, only one electrical line 2 being illustrated and the electrical line 2 being connected to a protective circuit 3. The protective circuit 3 may have a holding circuit 4, a control circuit 5 and a protective element 6. The holding circuit 4 is connected to the line 2 by a first terminal, the control circuit 5 is connected to the line 2 by a second terminal and the protective element 6 is connected to the line 2 by a third terminal. The protective circuit may serve for protecting the electrical line 2 from an overvoltage, in particular from an electrostatic discharge.

The function of the protective circuit 3 may consist in monitoring the voltage on the electrical line 2 by means of the holding circuit and upon detection of an undesirable voltage increase by means of the control circuit 5 switching the protective element 6 in such a way that electrical charge is dissipated from the electrical line 2 via a discharge path and a further voltage increase on the electrical line 2 is thus counteracted. For this purpose, the third terminal is connected to the discharge path via a discharge terminal.

The holding circuit 4 has a first and a second output 7, 8, which are connected to the control circuit 5. The control circuit 5 evaluates the signals, in particular the voltages on the first and second output 7, 8, and, upon detection of defined signals or voltages on the first and second outputs 7, 8 and given a sufficient voltage supply via the line 2, passes a control signal via a third output 9 to the protective element 6. Upon receiving the control signal, the protective element 6 is driven in such a way that electrical charge is dissipated from the electrical line 2 via a discharge path and a further increase in the voltage on the electrical line 2 may be counteracted in this way. The holding circuit 4, the control circuit 5 and the protective element 6 may be realized in one circuit in one device or in the form of a plurality of circuits and/or a plurality of devices. The control circuit and the holding circuit may be constructed in such a way that upon application of a supply voltage on the line 2, the holding circuit 4 under normal conditions has left the metastable state before the control circuit 5 has a sufficient supply voltage to be able to switch the protective element. If an electrostatic discharge occurs during the switch-on operation, then the control circuit 5 may attain a sufficient supply voltage before the holding circuit 4 has left the metastable state. Consequently, the line 2 is connected to the discharge path via the protective element by the control circuit 5.

Figure 2:
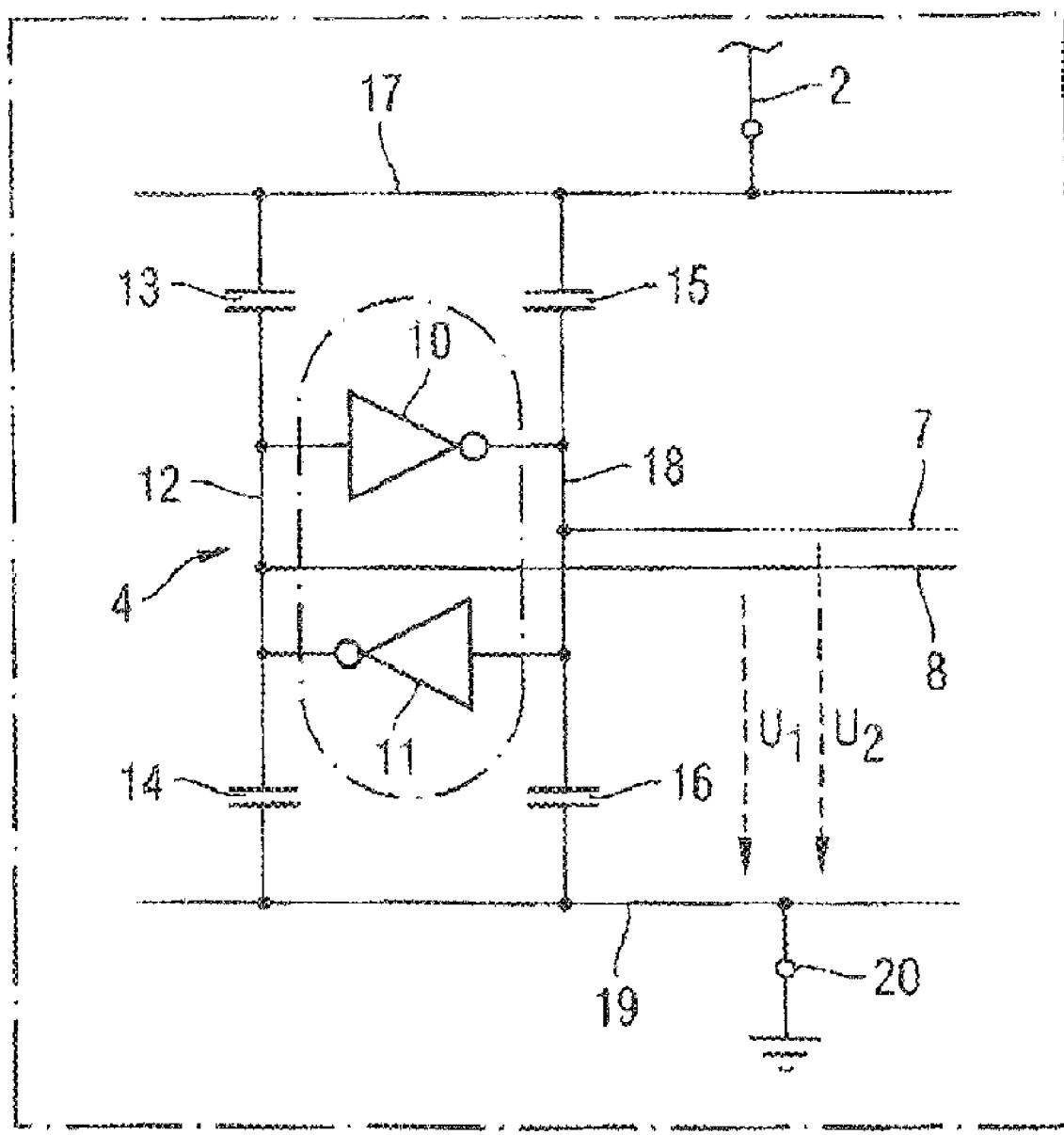
FIG. 2 shows a first embodiment of a bistable holding circuit, according to one embodiment.

FIG. 2 shows an embodiment in which the holding circuit 4 is for example realized in the form of a first and a second inverter circuit 10, 11. An output of the first inverter circuit 10 is connected to an input of the second inverter circuit 11. An output of the second inverter circuit 11 is connected to an input of the first inverter circuit 10. A connecting line 12 between the output of the second inverter circuit 11 and the input of the first inverter circuit 10 is connected via a first capacitor 13 to a further connecting line 17, which is connected to the electrical line 2.

A second connecting line 18, via which the output of the first inverter circuit 10 is connected to the input of the second inverter circuit 11, is connected to the further connecting line 17 via a third capacitor 15. In addition, the second connecting line 18 is connected via a fourth capacitor 16 to a second further connecting line 19 connected to a reference line 20. The reference line 20 may be connected to a ground potential or a different type of discharge path. Furthermore, the connecting line 12 is connected to the second further connecting line 19 via a second capacitor 14. The second output 8 is connected to the connecting line 12 and the first output 7 is connected to the connecting line 18. A bistable holding element 4 may be realized by the two feedback inverters 10, 11. The two inverters 10, 11 are preferably formed in identical fashion or preferably have an identical electrical function. What may be achieved on account of the bistable holding element 4 and as a result of the corresponding design of the first, second, third and fourth capacitors 13, 14, 15, 16 is that upon application or change of a voltage between the electrical line 2 and the reference line 20 connected to the second further connecting line 19, the holding element undergoes transition to a metastable state and the voltage levels on the first and second outputs 7, 8 are therefore in a medium range and approximately identical in magnitude. The medium range lies between the voltage on the line 2 and the voltage on the reference line 20.

The protective circuit 3 of FIG. 1 may protect against overvoltage, for example against electrostatic discharge during a switch-on operation of an electrical circuit 1 comprising at least one electrical line 2. Upon the switch-on of a voltage, for example a supply voltage, onto the line 2, the holding circuit 4 undergoes transition proceeding from a first state to a second state within a holding time. During the transition from the first state to the second state, the holding circuit 4 changes an output signal that is forwarded to the control circuit. The control circuit 5 is likewise connected to the line 2 and is supplied with voltage by the line. Upon application of the voltage to the line 2, the voltage at the control circuit rises within a start time to a sufficient supply voltage to be able to drive the protective element 6. In this case, the control circuit undergoes transition from a quiescent state to an operating state. The start time decreases as the temporal change in the voltage rises, such that, starting from a threshold value for the temporal change in the voltage on the line 2, the start time becomes shorter than the holding time. This may be the case in the event of an electrostatic discharge. If the control circuit 5 in the operating state detects a first state of the holding circuit 4, that is to say a metastable state, then the control circuit 5 drives the protective element 6 in such a way that the line 2 is connected to the discharge path via the protective element.

If the control circuit 5 in the operating state detects a second state of the holding circuit 4, that is to say one of the two stable states, then the control circuit 5 drives the protective element 6 in such a way that the line 2 is not connected to the discharge path via the protective element.

Consequently, the line 2 may be connected to the discharge path whenever the start time of the control circuit 5 for attaining the operating state is shorter than the holding time of the holding circuit. This may be the case whenever a temporal voltage change upon application of a voltage on the line 2 lies above a defined threshold value. This may be the case for example in the event of an electrostatic discharge. The control circuit and the holding circuit may be constructed in such a way that the holding time for normal switch-on operations or normal voltage jumps is shorter than the start time. Starting from a defined temporal voltage change, the holding time is longer than the start time and the protective element is activated.

The first, second, third and fourth capacitors 13, 14, 15, 16 illustrated in FIG. 2 can also be realized by parasitic capacitor effects on electrical lines, with the result that it is not necessary to provide real capacitors. Consequently, capacities of electrical lines may also be used instead of the first, second, third and further capacitors.

After a holding time, the holding element undergoes transition from the metastable first state to one of two possible stable states in which either the voltage at the first output 7 is at a high level and the voltage at the second output 8 is at a low level, or the voltage at the first output 7 is at a low level and the voltage at the second output 8 is at a high level.

The holding element leaves the metastable state on account of random or intentional asymmetries in the circuit. The holding time during which the holding element is in the metastable state may be shortened or lengthened in a targeted manner by means of a suitable dimensioning of the frequency-dependent loop gain of the holding element and the symmetries. In this way the circuit arrangement can be set to a corresponding reaction time of the control circuit 5.

Preferably, a long holding time of the holding element in the metastable state can be attained by the loop gain being kept low in a targeted manner at higher frequencies.

The holding circuit with the two feedback inverter circuits 10, 11 may function, in the event of a voltage increase between the electrical line 2 and the reference line 20, in such a way that, on account of the feedbacks between the two inverter circuits 10, 11, the voltage levels on the first and the second output 7, 8 during the holding time may be approximately identical in magnitude. However, if the two inverter circuits 10, 11 are formed differently in terms of the driver strength and/or if the first, the second, the third and the fourth capacitor 13, 14, 15, 16 are not identical in magnitude and an imbalance arises as a result, then over time a high voltage potential will form on the first or the second output 7, 8 and a low voltage potential will form on the other output 7, 8. On which of the two outputs 7, 8 a high voltage potential forms and on which of the two outputs 7, 8 a low voltage potential forms depends on the asymmetry of the circuit arrangement. In any case, after the holding time a stable state of the holding circuit will unambiguously result, in which stable state the first or the second output 7, 8 has a high or a low voltage potential in comparison with the other output, that is to say the second or respectively the first output 7, 8.

Given the approximately identical voltage potential and/or given medium voltages on the first and second output 7, 8, the control circuit 5 detects the metastable state of the holding circuit. The medium range of the voltages lies between the voltages of the line 2 and the reference line 20. In the case of a high voltage potential on one of the two outputs 7, 8 and a low voltage potential on the other output 7, 8, the control circuit detects a stable state of the holding circuit 4. Consequently, the control circuit 5 may distinguish three states of the holding circuit 4, namely the metastable state and two stable states. The metastable state is a signal for a great voltage change on the electrical line 2 that was caused for example by an electrostatic discharge.

Figure 3:
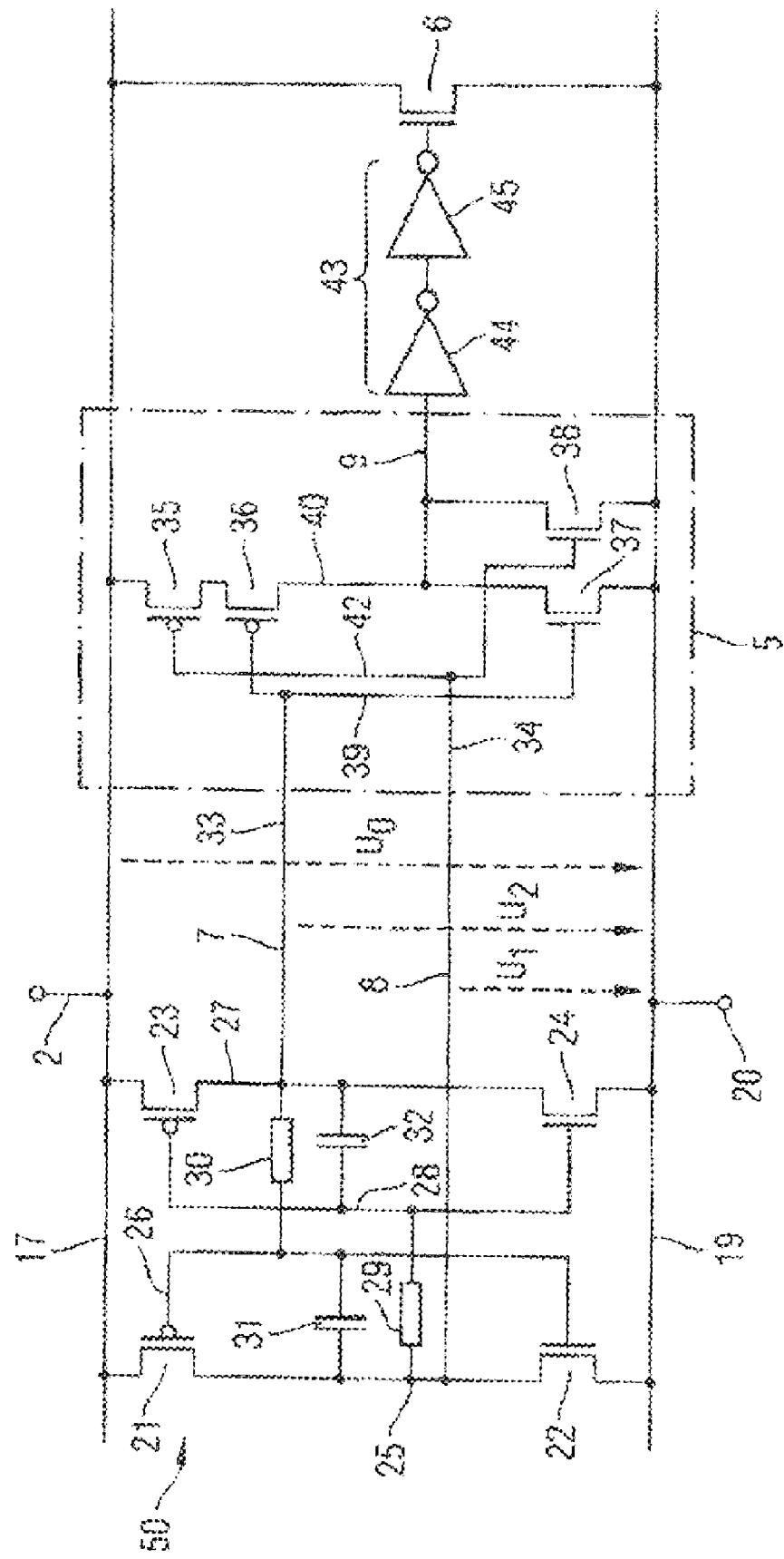
FIG. 3 shows a further embodiment with a control circuit, a driver circuit and a discharge path.

FIG. 3 shows an embodiment of a further holding circuit 50 realized in the form of transistors 21, 22, 23, 24 that are coupled to one another. The functioning of the further holding circuit 50 corresponds to the functioning of the holding circuit 4. In addition, FIG. 3 illustrates an exemplary embodiment of the control circuit 5.

The further holding circuit 50 has two series circuits each formed by two transistors. A first series circuit has a first transistor 21, which is connected in series with a second transistor 22 between the further connecting line 17 and the second further connecting line 19. The control terminals of the first and second transistors 21, 22 are connected to one another via a fourth connecting line 26. The first transistor has an inverted doping in contrast to the second transistor. In the exemplary embodiment illustrated, the first transistor 21 is realized in the form of a P-MOS transistor. The second transistor 22 is realized in the form of an N-MOS transistor. The source terminal of the first transistor 21 is connected to the further connecting line 17 and the drain terminal of the first transistor 21 is connected to the drain terminal of the second transistor 22. The source terminal of the second transistor 22 is connected to the second further connecting line 19. Consequently, a third connecting line 25 is formed between the drain terminals of the first and second transistors 21, 22.

The second series circuit comprises a third and a fourth transistor 23, 24, which are connected between the further connecting line 17 and the second further connecting line 19. The third and fourth transistors have inverted dopings. In the exemplary embodiment illustrated, the third transistor 23 is formed in the form of a P-MOS transistor and the fourth transistor 24 is formed in the form of an N-MOS transistor. The source terminal of the third transistor 23 is connected to the further connecting line 17. The drain terminal of the third transistor 23 is connected to the drain terminal of the fourth transistor 24 via a fifth connecting line 27. The source terminal of the fourth transistor 24 is connected to the second further connecting line 19. The control terminals of the third and fourth transistors 23, 24 are connected to one another via a sixth connecting line 28. The first output 7 is connected to the fifth connecting line 27. The second output 8 is connected to the third connecting line 25. Moreover, the sixth connecting line 28 is connected to the third connecting line 25 via a first resistor 29. Furthermore, the fifth connecting line 27 is connected to the fourth connecting line 26 via a second resistor 30.

Depending on the embodiment chosen, a fifth and sixth capacitance 31, 32 can be formed between the first and second connecting lines 25, 26 and the fifth and sixth connecting lines 27, 28. The first and second resistors 29, 30 and the fifth and sixth capacitances 31, 32 can also be realized in the form of MOS transistors.

A targeted asymmetry of the holding circuit of FIG. 3 can be achieved by one of the four transistors 21, 22, 23, 24 of one series circuit being dimensioned to be somewhat weaker or stronger than the respective counterpart of the other series circuit. By way of example, the first and the third transistor 21, 23 or the second and the fourth transistor 22, 24 are formed with different strengths. This results in a better reproducibility of the dwell time, that is to say the holding time of the further holding circuit 50 in the metastable state in the event of a great voltage rise between the electrical line and the reference line 20. Furthermore, the further holding circuit 50 of FIG. 3 has the advantage that the loop gain is formed to be low at higher frequencies and a long dwell time of the holding circuit 50 in the metastable state, that is to say a long holding time, is thereby attained.

A first voltage U1 is formed between the second further connecting line 19 and the second output 8. A second voltage U2 is formed between the second further connecting line 19 and the second output 7, and a third voltage U0 is formed between the second further connecting line 19 and the further connecting line 17.

FIG. 3 shows a realization of the control circuit 5 in the form of an asymmetrically dimensioned NOR gate. An asymmetrically dimensioned NAND gate can also be used instead of the asymmetrically dimensioned NOR gate. In one embodiment, the control circuit in the operating state generates at the third output 9 an output signal, which brings about activation of the protective element, when a potential approximately in the middle between the potentials of the electrical line 2 and the reference line 20 is present at the first and at the second input 33, 34 of the control circuit 5, which are connected to the first and the second outputs 7, 8, respectively. Consequently, it is possible to use any control circuit which provides this function. If an approximately identical potential is present at the first and second outputs 7, 8, low signals at the first and second outputs 7, 8 would be detected by the control circuit.

In a further embodiment, the control circuit in the operating state generates an output signal at the third output 9 when voltages that are approximately identical in magnitude are present at the first and second input 33, 34.

The NOR gate has a fifth transistor 35, a sixth transistor 36 and a seventh transistor 37, which are connected in series. In this embodiment, the fifth transistor 35 is formed as a PMOS transistor, the source terminal of which is connected to the further connecting line 17. The drain terminal of the fifth transistor 35 is connected to a source terminal of the sixth transistor 36. The sixth transistor 36 is likewise formed as a PMOS transistor. The drain terminal of the sixth transistor 36 is connected via an eighth connecting line 40 to the drain terminal of the seventh transistor 37, which is formed as an NMOS transistor. The source terminal of the seventh transistor 37 is connected to the second further connecting line 19. A first input 33 of the control circuit 5, which input is connected to the first output 7, is connected to a seventh connecting line 39 connected to the control terminals of the sixth and seventh transistors 36, 37. The eighth connecting line 40 is connected to the third output 9. Furthermore, an eighth transistor 38 is arranged, which is formed as an NMOS transistor and is connected to the second further connecting line 19 by a source terminal and to the third output 9 by a drain terminal. The control terminal of the eighth transistor 38 is connected to a ninth connecting line 42, which is likewise connected to the control terminal of the first transistor 35 and is additionally connected to the second output 8 via a second input 34.

Approximately identical voltages or medium voltages, that is to say neither a low nor a high potential, at the first and at the second output 7, 8 are an indication of a metastable state of the holding element. The control circuit 5 may be formed in such a way that medium voltages which at the first and at the second input 33, 34 lead to a different output signal at the third output 9 compared to a high and a low voltage (high and low potential) at the first and second output 7, 8. This is achieved in the exemplary circuit illustrated by virtue of the fact that the first and second transistors 35, 36 are formed as PMOS transistors having a large gain capacity and the seventh and eight transistors 37, 38 are formed as NMOS transistors having a weak gain capacity.

If medium voltages or approximately identical voltages are present at the first and at the second input 33, 34, that is to say if the further holding circuit 50 is in a metastable state, then a control signal is present at the third output 9 of the control circuit typically for a few hundred nanoseconds, which control signal indicates the occurrence of a fast temporal change in the voltage between the electrical line 2 and the reference line 20. In this case, it is also possible to detect voltage changes which are generated by an electrostatic discharge. Moreover, the control circuit detects whether a slow switching operation as in the case of a normal presence of the supply voltage on the electrical line 2 is present. This is the case when the further holding circuit 50 is in a stable state and the voltages at the first and second outputs 7, 8 differ in magnitude.

The output signal at the third output 9 then controls the protective element 6, which has a MOS-FET or a thyristor, for example, and, upon detection of a fast temporal voltage change between the electrical line 2 and the reference line 20, connects electrical line 2 to a discharge potential, for example a ground potential, via the protective element 6. The protective element 6 can be formed in such a way that it is activated upon detection of an electrostatic discharge or is deactivated in the absence of an electrostatic discharge, in order to prevent an inadvertent activation of a self-activating protective element.

The third output 9 is connected to the protective element 6, which is formed in the form of an NMOS transistor in FIG. 3. An amplifier circuit 43 is preferably provided between the third output 9 and the control terminal of the NMOS transistor of the protective element 6, said amplifier circuit having a third and fourth inverter 44, 45 connected in series. A source terminal of the NMOS transistor of the protective circuit 6 is connected to the second further connecting line 19 and the drain terminal of the NMOS transistor of the protective element 6 is connected to the further connecting line 17. Instead of the NMOS transistor, it is also possible to use any other type of switch which, upon detection of an electrostatic discharge, enables an electrically conductive connection between the further connecting lines 17 and the reference line 20. Depending on the embodiment chosen, the source terminal of the NMOS transistor of the protective element 6 can also be connected to a different line connected to the ground potential.

Figure 4:
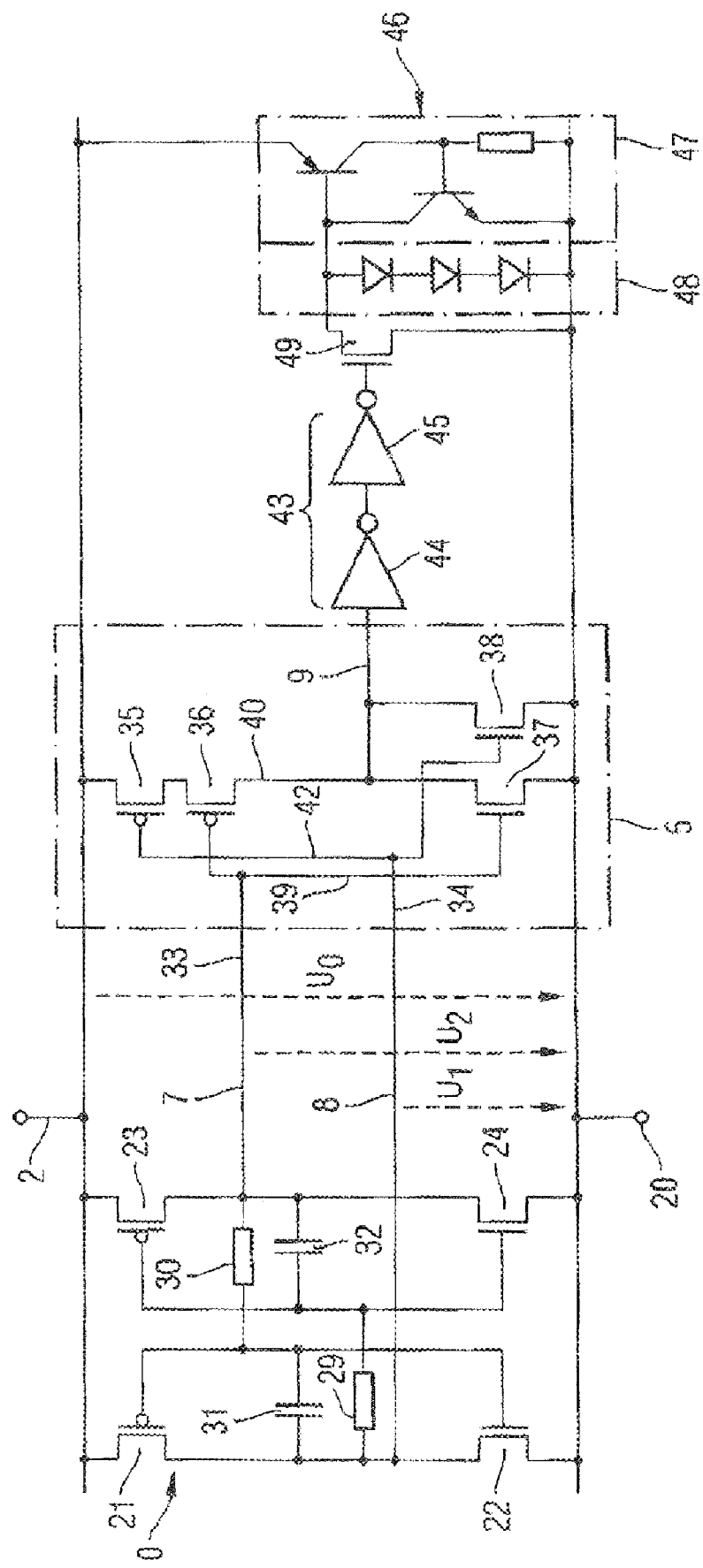
FIG. 4 shows a further embodiment of the protective circuit with a thyristor in the discharge path.

FIG. 4 shows a further embodiment of the protective circuit, in which a further protective element 46 is provided, which is connected to the third output 9 of the control circuit 5. The further protective element 46 has a thyristor circuit 47 acting as protective element. A diode circuit 48 is provided in parallel with the thyristor circuit. Moreover, an output transistor 49 is provided, which is formed as an NMOS transistor in the embodiment chosen.

The control terminal of the output transistor 49 is connected to the third output 9 of the control circuit 5 or to the output of the amplifier circuit 43 if the latter is provided. The diode circuit 48 comprises a series circuit of four diodes connected between the source terminal and the drain terminal of the output transistor 49. The thyristor circuit 47 has a resistor that prevents inadvertent triggering.

Figure 5:
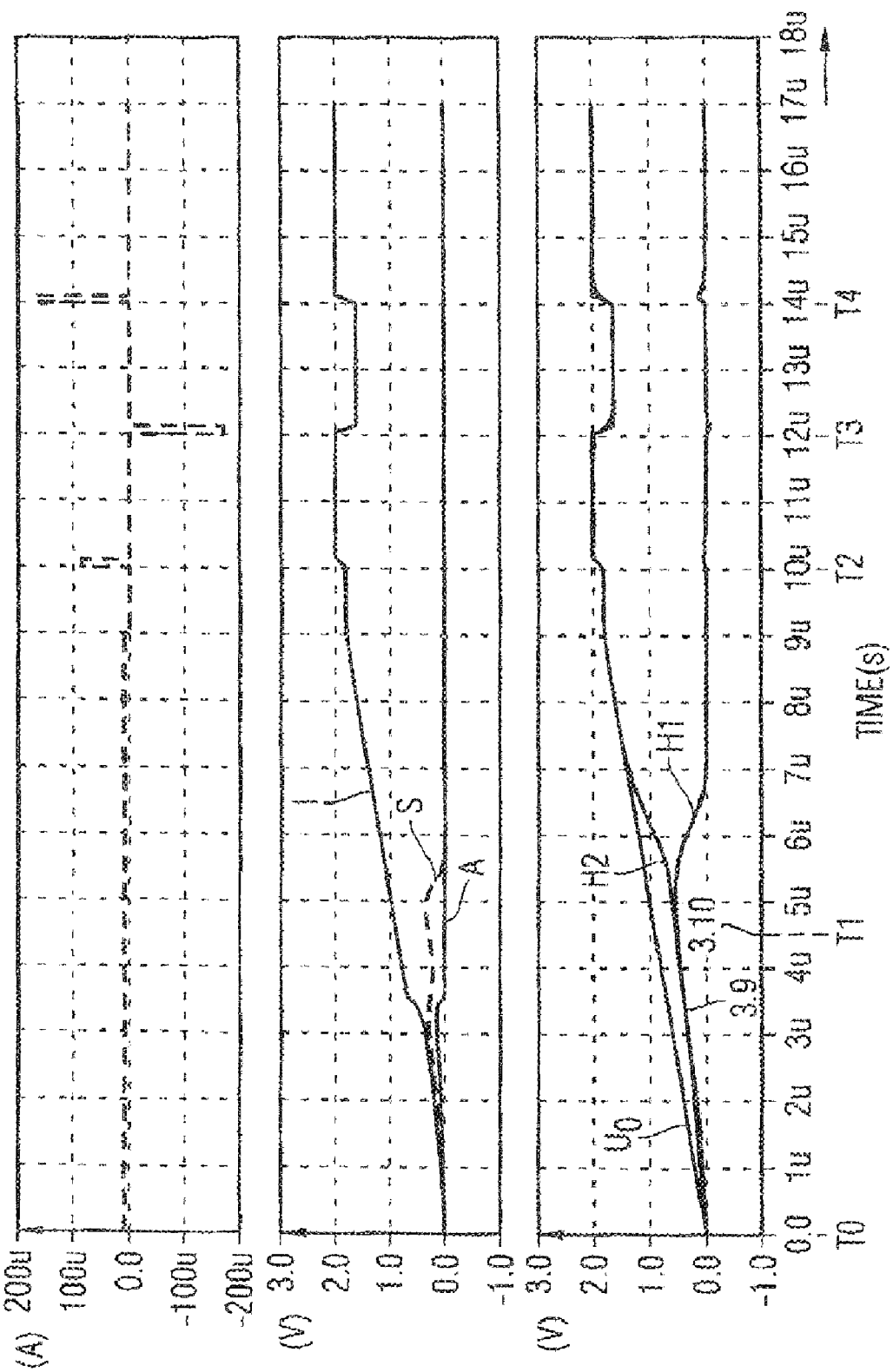
FIG. 5 shows a diagram for currents and voltages of the protective circuit for a normal switch-on operation, according to one embodiment.

FIG. 5 shows currents and voltages that occur during the normal switch-on operation, that is to say the application of a supply voltage to the electrical line 2. The topmost diagram illustrates the current flow on the electrical line 2 against time. The middle diagram illustrates the control voltage S at the third output 9 of the control circuit 5, the drive signal A at the control input of the protective element 6, and the voltage signal I present between the third and fourth inverters 44, 45. The bottommost diagram illustrates against time the third voltage U0, that is to say the voltage difference between the electrical line 2 and the reference line 20, the first output signal H1 of the first output 7 of the further holding circuit 50, and the second output signal H2 of the second output 8 of the further holding circuit 50.

The bottommost diagram reveals that the switch-on voltage, that is to say the third voltage U0, rises continuously over time and attains the maximum voltage of 2 V at a second instant T2 of 10 µs. Between the zeroth instant T0 at 0 µs and a first instant T1 approximately at 4.5 µs, the further holding circuit 50 is in a metastable state in which the voltages of the first and second output signals H1, H2 on the first and second outputs 7, 8 are approximately identical in magnitude and rise slowly. Starting from the first instant T1 at approximately 4.5 µsec, the output signals separate on account of the asymmetry of the further holding circuit 50, the second output signal H2 rising further and in the course of time running parallel to the third voltage U0. The first output signal H1 decreases in the course of time to the value 0 volts.

In this initial phase, the voltage signal I rises slowly over time and attains the maximum value of 2V at the second instant T2. It can clearly be discerned from the middle diagram that the drive signal A for controlling the protective element 6 only rises slowly in the initial phase, but overall remains below 0.2 V in value and, after a transient recovery time, falls to 0 volts already before the first instant T1. As a result, a turning on of the protective element 6 is not attained. Consequently, under these voltage conditions, the electrical line 2 is not connected to the discharge path. The control voltage 6 at the third output 9 rises somewhat initially but falls to 0 volts after a short time.

At the second, a third and a fourth instant T2, T3, T4, fluctuations occur on the electrical line 2, and are manifested in current spikes on the electrical line 2 in the topmost diagram. There are correspondingly slight rises in the voltage signal I or falls in the voltage signal I at the corresponding instants. However, these do not cause the drive signal A to rise correspondingly to activate the protective circuit 6. Consequently, during this switch-on operation, no charge via the protective element is dissipated from the electrical line 2 via the protective element 6.

Figure 6:
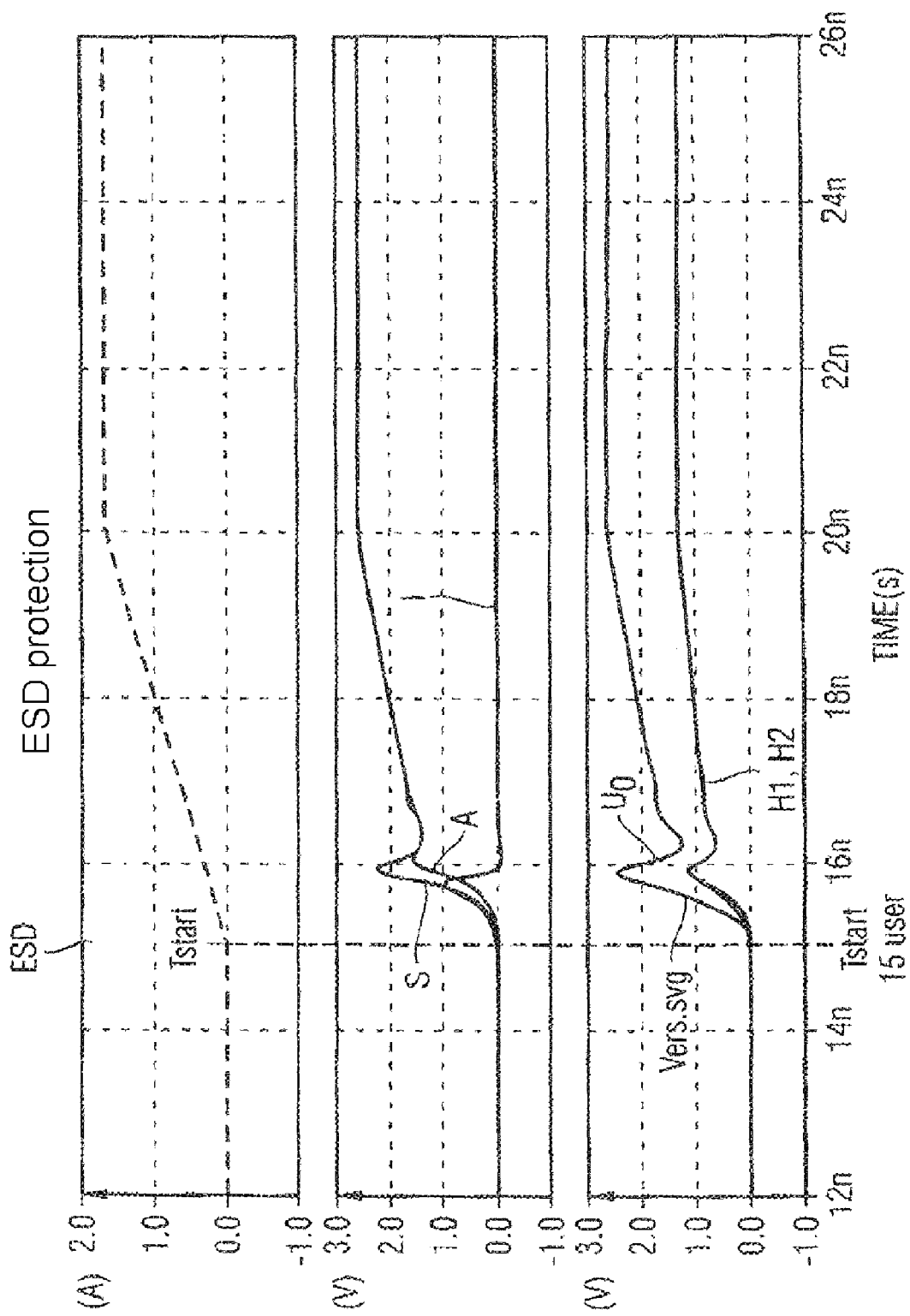
FIG. 6 shows a diagram for currents and voltages of the protective circuit for a first embodiment.

FIG. 6 shows a switch-on situation in which a fast temporal rise in the voltage on the electrical line 2 occurs for example as a result of an electrostatic discharge and leads to switching on of the protective element 6. The time axis T is illustrated in nanoseconds in FIG. 6. The topmost diagram once again illustrates the current on the electrical line 2, which rises at a start instant Tstart from the value 0 within 5 ns with a very great rise to the value 1.8 A. The middle diagram illustrates the control voltage S at the third output 9 of the control circuit 5, which rises very greatly after the start instant Tstart and attains the voltage value of above 2 V within 1 ns. Correspondingly, the drive signal A of the protective element 5 also rises and turns on the protective element 6. The protective element conducts approximately at a voltage of 1.0 V, which is attained shortly before the instant of 16 ns. The bottommost diagram illustrates the third voltage U0, that is to say the voltage difference between the electrical line 2 and the reference line 20. This voltage rises very greatly after the start instant at 15 ns and exceeds the value of 2 V before the instant of 16 ns. At the same time, the first and second output signals H1, H2 at the first and second outputs 7, 8 of the holding circuit 4 rise to a value of 1V, the voltages on the first and second outputs 7, 8 being approximately identical in magnitude. As a result of the fast rise in the voltage U0, the control circuit 5 has a sufficient voltage supply to provide, at the third output 9, a corresponding control signal for turning on the protective element 6. The effect of the turning on is that the third voltage U0 decreases again after attaining a maximum value and after attaining the local minimum shortly after the instant of 16 ns rises again slowly to a value of 2.5V. An excessively great rise in the voltage of the electrical line 2 is avoided in this way. Electrical circuits connected to the electrical line 2 are thereby protected from an overvoltage.

In contrast to the situation of FIG. 5, the control circuit 5, at the instant at which the first and the second output signals H1, H2 are approximately identical, already has a sufficient voltage supply to output a control voltage S and hence a sufficient drive signal A for driving the protective element 6.

During the normal switch-on operation, the supply voltage of the control circuit 5, at the instant at which the first and second output signals H1, H2 of the further holding circuit 50 still have an approximately identical value, does not attain a sufficiently high value to be able to provide a control voltage S at the third output 9 for switching the protective element 6. This is achieved in a simple manner by virtue of the fact that the control circuit 5 is supplied by the voltage on the electrical line 2 and the start time until attaining an operating state of the control circuit 5, in which state a drive signal is generated, is longer than the holding time in the case of a normal switch-on operation. However, if an electrostatic discharge occurs, for example during the switch-on operation, then the control circuit 5 is brought to the operating state before the end of the holding time.

Figure 7:
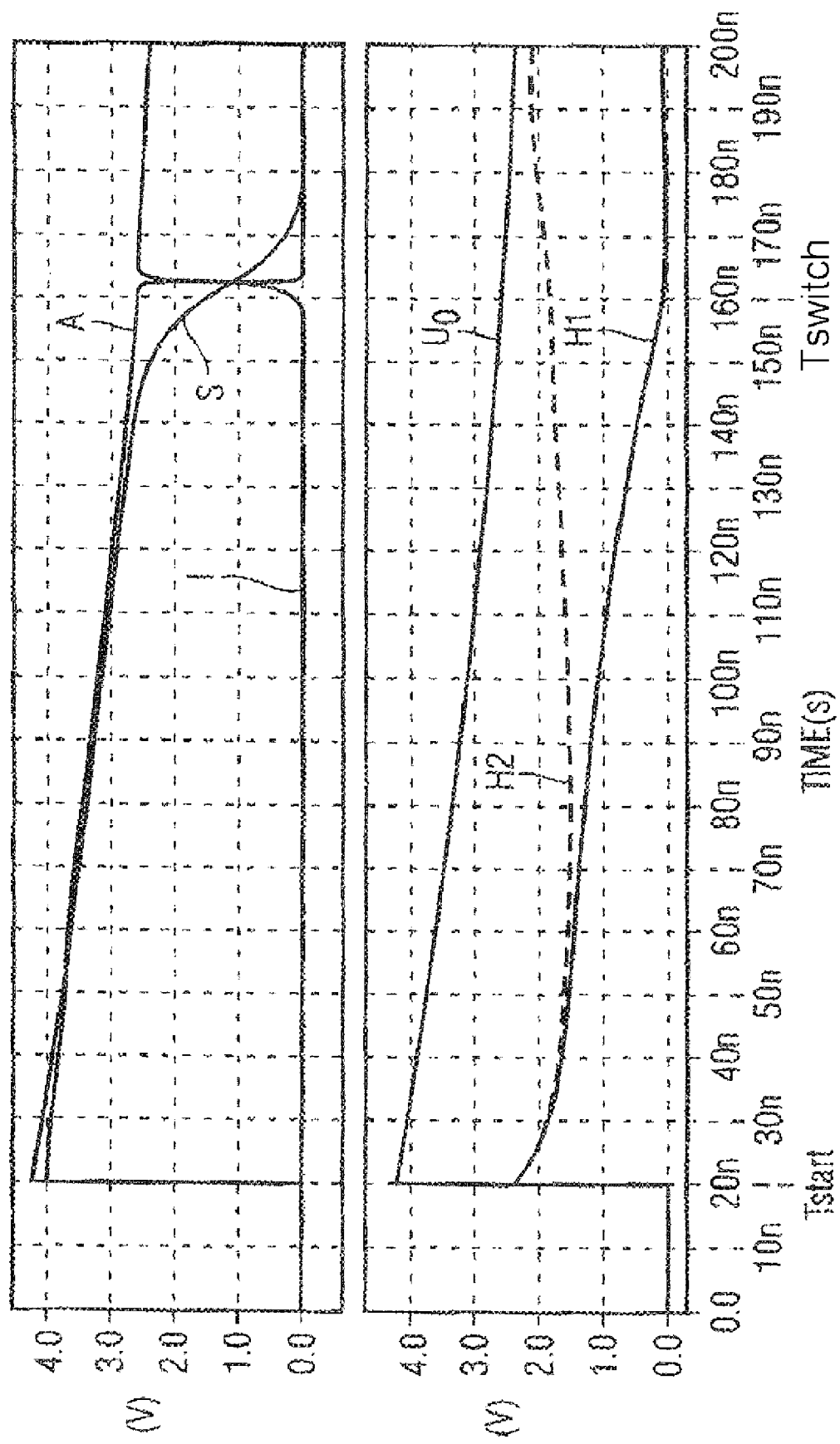
FIG. 7 shows a diagram for currents and voltages of the protective circuit for a second embodiment.

FIG. 7 shows a switching situation in which an electrostatic discharge occurs, the protective element being activated in the course of this. An upper diagram illustrates the drive signal A at the control input of the protective element 6, the control voltage F from the third output 9 of the control circuit S and the voltage signal 1, present between the third and fourth inverters 44, 45, against time. The lower diagram illustrates against time the third voltage U0, that is to say the voltage difference between the electrical line 2 and the reference line 20, the first output signal H1 of the first output 7 of the further holding circuit 50, and the second output signal H2 of the second output 8 of the further holding circuit 50.

The lower diagram reveals that the supply voltage rises abruptly at the instant Tstart to a value of 4 V and subsequently falls continuously. As a result of the great voltage rise, the start time for the control circuit 5 is shortened below the holding time of the further holding circuit 50, with the result that the control circuit 5 detects a metastable state of the further holding circuit 50 in the operating state and thus drives the protective element 6 in such a way that the electrical line 2 is connected to the discharge path. Shortly after the start instant Tstart, the further holding circuit 50 outputs a first output signal H1 and a second output signal H2 at the first output 7 and a second output 8, respectively, which are approximately identical in magnitude. Consequently, the control circuit 5 detects a metastable state. In the course of time, the second output signal H2 is pulled to a high voltage level and the first output signal H1 is pulled to a low voltage level.

The control circuit 5 outputs at the control input of the protective element 6 the drive signal A with a high voltage, with the result that the protective element 6 is turned on and connects the electrical line 2 to the discharge path. The drive signal A is held at the high voltage level over a trigger time of approximately 142 ns. The control voltage S at the third output of the control circuit 5 has a voltage potential approximately identical to that of the drive signal H, but the control voltage S already starts to fall after 120 ns. At a switching instant Tswitch, the drive signal A is switched over from a high-level signal to a low-level signal. Consequently, the protective element 6 is turned off at the switching instant Tswitch and electrical line 2 is disconnected from the discharge path. Shortly after the start instant Tstart, the voltage signal I has a value of 0 V and only at the switching instant Tswitch does it rise to a high-level voltage signal having a value of above 2 V.

It can be seen from FIG. 7 that after the driving of the protective element 6, the protective element 6 remains switched on for a defined time duration, in this case for approximately 142 ns, even though the first and second output signals H1, H2 already develop into different voltage levels.

In one embodiment of the further holding circuit 50 of FIG. 4, the second transistor 22, which is formed as an NFET transistor, has a conduction channel having a width of 0.44 µm and a length of 10 µm. The first transistor 21, which is formed as a PFET transistor, has a channel having a width of 0.44 µm and a length of 10 µm. The third transistor 23, which is formed as a PFET transistor, has a channel having a width of 0.48 µm and a length of 10 µm. The fourth transistor 24, which is formed as an NFET transistor, has a width of 0.44 µm and a length of 10 µm. The pulse duration of the control signal at the third output 9 is defined by the asymmetry between the first and third transistors 21, 23.

In one embodiment, the seventh and eighth transistors 37, 38 are formed as NFET transistors whose channel regions have a width of 2.2 µm and a length of 1.1 µm. In one embodiment, the fifth and sixth transistors 35, 36 of the control circuit 5 are formed as PFET transistors having a channel region with widths of 17.6 µm and lengths of 0.18 µm. In a further embodiment, the first and second resistors 29, 30 can be dispensed with, so that only parasitic line resistances are present. Moreover, in a further embodiment, the fifth and sixth capacitances between the third and fourth connecting lines 25, 26 and the fifth and sixth connecting lines 27, 28 may have a value of 20 fF.

After the detection of a metastable state of the holding circuit 8, the control voltage S which, with the parameters described, has a pulse length of 50 to 300 ns is generated at the third output 9. That is to say that after the transition of the further holding circuit 50 to a stable state, that is to say the diverging of the voltages at the first and the second outputs 7, 8, over a period of 50 to 300 ns, the control circuit 5 holds the protective circuit 6 in the conducting state.

The capacitances between the third and fourth connecting lines 25, 26 and between the fifth and sixth connecting lines 27, 28 may lie within the range of 5 to 50 fF.

The protective circuit described can be used in any type of electrical or electronic circuit. Preferably, the protective circuit can be used in a memory circuit, in particular in a DRAM memory component, and the electrical line 2 can be connected to the supply voltage, for example. The reference line 20 can be connected to the ground potential in a memory circuit.

The functioning of the invention has been explained using the example of the further holding circuit 50. The holding circuit 4 functions in an analogous manner.

While the foregoing is directed to embodiments of the present invention, other and further embodiments of the invention may be devised without departing from the basic scope thereof, and the scope thereof is determined by the claims that follow.

What is claimed is:

1. A method for protecting a line against overvoltage, comprising:
    monitoring a voltage on the line by a holding circuit connected to the line by a first terminal;
    upon application of a voltage on the line, transitioning the holding circuit from a first metastable state to a second stable state over a holding time;
    monitoring a state of the holding circuit by a control circuit, the control circuit being supplied with current by the line;
    upon application of a voltage, transitioning the control circuit from a quiescent state to an operating state after a start time;
    connecting the line to a discharge path if the holding circuit is still in the first state once the control circuit is in the operating state.

2. The method of claim 1, wherein the connecting is done by the control circuit.

3. A protective circuit to protect an electrical circuit against overvoltage, comprising:
    a holding circuit comprising a first terminal for connection to an electrical line of the electrical circuit; wherein the holding circuit, upon application of a voltage on the first terminal, is configured to transition from a first state to a second state after a holding time;
    a control circuit connected to the holding circuit and comprising a second terminal for connection to the line; wherein the control circuit, upon application of a voltage at the second terminal, is configured to transition from a quiescent state to an operating state after a start time; and
    a protective element comprising a third terminal for connection to the line; wherein the control circuit while in the operating state, upon detection of the first state of the holding circuit, is configured to connect the third terminal to a discharge path in order to dissipate electrical charge from the line via the third terminal.

4. The protective circuit as claimed in claim 3, wherein the holding circuit is connected to the control circuit via at least one output; wherein the holding circuit is configured to emit different output signals via the output in the first and in the second state; and wherein the control circuit in the operating state and upon detection of the second state of the holding circuit does not connect the line to the discharge path via the protective element.

5. The protective circuit as claimed in claim 3, wherein:
    the start time of the control circuit for attaining the operating state for temporal voltage changes on the second terminal which lie below a threshold value is longer than the holding time required by the holding circuit for attaining the second state, and
    the start time for attaining a sufficient supply voltage for voltage changes on the line which lie above the threshold value is shorter than the holding time.

6. The protective circuit as claimed in claim 4, wherein:
    the start time of the control circuit for attaining the operating state for temporal voltage changes on the second terminal which lie below a threshold value is longer than the holding time required by the holding circuit for attaining the second state, and
    the start time for attaining a sufficient supply voltage for voltage changes on the line which lie above the threshold value is shorter than the holding time.

7. The protective circuit as claimed in claim 3, wherein the first state represents a metastable state which, after the holding time, undergoes transition to a stable state representing the second state.

8. The protective circuit as claimed in claim 3, wherein the protective element comprises a transistor configured to connect the line to the discharge path, and wherein the transistor is controllable by the control circuit.

9. The protective circuit as claimed in claim 3, wherein the holding circuit comprises a first inverter circuit and a second inverter circuit, wherein an input of the first inverter circuit is connected to an output of the second inverter circuit, wherein an input of the second inverter circuit is connected to an output of the first inverter circuit, wherein respective outputs of the inverter circuits are connected to a respective input of the control circuit; wherein the control circuit, given approximately identical voltages on the first and second inputs, is configured to detect a first, metastable state on the first and second inputs, and wherein the control circuit, in the operating state, is configured to connect the discharge path to the line when the voltages of the two inputs are approximately identical in magnitude or in a medium voltage range.

10. The protective circuit as claimed in claim 3, wherein the holding circuit comprises a first inverter circuit and a second inverter circuit, wherein an input of the first inverter circuit is connected to an output of the second inverter circuit, wherein an input of the second inverter circuit is connected to an output of the first inverter circuit, wherein respective outputs of the inverter circuits are connected to a respective input of the control circuit; wherein the control circuit, given medium voltages on the first and second inputs, is configured to detect a first, metastable state, wherein the control circuit, in the operating state, is configured to connect the discharge path to the line when the voltages of the two inputs are approximately identical in magnitude or are in a medium voltage range.

11. The protective circuit as claimed in claim 9, wherein the two inverter circuits are formed in identical fashion.

12. The protective circuit as claimed in claim 9, wherein each input of the inverter circuits is connected to the line via at least one respective first capacitor, and wherein each input of the inverter circuits is connected to a reference line via at least one respective second capacitor.

13. The protective circuit as claimed in claim 3, wherein the control circuit is formed in the form of an asymmetrical NOR gate comprising two inputs connected to the two outputs of the holding element, wherein an output of the NOR gate is connected to a control input of the protective element, wherein the NOR gate outputs a control voltage for controlling the protective element if approximately medium voltages are present at the inputs of the control circuit while the control circuit is in the operating state.

14. The protective circuit as claimed in claim 3, further comprising a driver circuit located at the output of the control circuit and configured for amplifying an output signal.

15. The protective circuit as claimed in claim 3, wherein the protective element comprises a thyristor in the discharge path, the thyristor being configured to connect the third terminal to a ground potential in a driven state.

16. An apparatus, comprising:
   an integrated circuit; and
   a protective circuit to protect the integrated circuit against overvoltage, comprising:
      a holding circuit comprising a first terminal for connection to an electrical line of the electrical circuit; wherein the holding circuit, upon application of a voltage on the first terminal, is configured to transition from a first state to a second state after a holding time;
      a control circuit connected to the holding circuit and comprising a second terminal for connection to the line; wherein the control circuit, upon application of a voltage at the second terminal, is configured to transition from a quiescent state to an operating state after a start time; and
      a protective element comprising a third terminal for connection to the line; wherein the control circuit while in the operating state, upon detection of the first state of the holding circuit, is configured to connect the third terminal to a discharge path in order to dissipate electrical charge from the line via the third terminal.

17. The apparatus of claim 16, wherein the integrated circuit is a dynamic random access memory (DRAM) circuit.

* * * * *